(12) United States Patent
Usoskin et al.

(10) Patent No.: US 7,586,717 B2
(45) Date of Patent: Sep. 8, 2009

(54) ELECTRICAL DEVICE FOR CURRENT CONDITIONING

(75) Inventors: Alexander Usoskin, Höbach (DE); Burkhard Prause, Gründau (DE)

(73) Assignee: European High Temperature Superconductors GmbH & Co. KG, Alzenau (DE)

(*) Notice: Subject to any disclaimer, the term of this patent is extended or adjusted under 35 U.S.C. 154(b) by 426 days.

(21) Appl. No.: 11/622,289

(22) Filed: Jan. 11, 2007

(65) Prior Publication Data

US 2007/0173410 A1 Jul. 26, 2007

(30) Foreign Application Priority Data

Jan. 13, 2006 (EP) .................... 06000723

(51) Int. Cl.
*H02H 7/00* (2006.01)
(52) U.S. Cl. ...................... 361/19
(58) Field of Classification Search ............ 361/19; 505/211; 174/125.1; 336/DIG. 1
See application file for complete search history.

(56) References Cited

U.S. PATENT DOCUMENTS

| | | | | |
|---|---|---|---|---|
| 3,443,255 A | * | 5/1969 | Massar | 336/58 |
| 3,629,690 A | * | 12/1971 | Massar | 361/19 |
| 3,703,664 A | | 11/1972 | Cronin | 317/20 |
| 5,153,804 A | * | 10/1992 | Pham et al. | 361/19 |
| 5,250,508 A | * | 10/1993 | Pham | 505/211 |
| 5,379,020 A | | 1/1995 | Meier et al. | 505/211 |
| 5,694,279 A | | 12/1997 | Mumford | 361/19 |
| 5,930,095 A | * | 7/1999 | Joo et al. | 361/58 |

FOREIGN PATENT DOCUMENTS

| DE | 195 24 579 A1 | 1/1997 |
|---|---|---|
| JP | 2002 262450 A | 9/2002 |

OTHER PUBLICATIONS

Granados et al. "Hybrid Superconducting Fault Current Limiter Based on Bulk Melt Textured $YBa_2Cu_3O_7$ Ceramic Composites" 1998 Applied Superconductivity Conference vol. 9 No. 2 (pp. 1308-1311), Jun. 1999.
Granados et al. "Design, Building Up and Testing of a 400 kVA Hybrid FCL" Physica C vol. 372-376 (pp. 1680-1683), Aug. 2002.

(Continued)

*Primary Examiner*—Fritz M Fleming
*Assistant Examiner*—Terrence R Willoughby
(74) *Attorney, Agent, or Firm*—Baker Botts L.L.P.

(57) ABSTRACT

An electrical device for current conditioning has a primary spool, a secondary spool which has a quenchable superconductor exhibiting a transition from a low resistive state to a high resistive state when a critical value of the electric current is exceeded. The secondary spool is coupled through a common part of magnetic flux with the primary spool, the secondary spool further has a metallic member 6 which form a closed loop circuit, and a cryostat 5 providing a cooling of the secondary spool. The secondary spool 2,3 has at least one element 3 based on a substantial fraction of a non-quenchable conductor that exhibits a minor dependence of its resistance on current and magnetic field, and a fraction of the quenchable superconductor and at least one turn of the non-quenchable conductor 3 and the quenchable superconductor 2 is electrically jointed in series providing a closed loop circuit.

20 Claims, 6 Drawing Sheets

OTHER PUBLICATIONS

Tixador "Experimental Results on an Hybrid Superconducting Current Limiter" 1994 Applied Superconductivity Conference vol. 5 No. 2 (pp. 1055-1058), Jun. 1995.

Choi et al. "Switching Properties of a Hybrid Type Superconducting Fault Current Limiter Using YBCO Stripes" IEEE Transactions on Applied Superconductivity vol. 12 No. 3 (pp. 1833-1838), Sep. 2002.

* cited by examiner

View along arrow X

ELECTRICAL DEVICE FOR CURRENT CONDITIONING

RELATED APPLICATION

This application claims priority from European Patent Application No. 06 000 723.4, which was filed on Jan. 13, 2006, and is incorporated herein by reference in its entirety.

TECHNICAL FIELD

The invention relates to an electrical device for conditioning of electric current.

BACKGROUND

An electrical device for current conditioning is known from the U.S. Pat. No. 5,379,020. Examples of current conditioning devices are also sometimes referred to as current limiters or fault current limiters. In U.S. Pat. No. 5,379,020, the current conditioning is provided by a electrical device consisting of a primary spool, a secondary spool which contains a quenchable superconductor exhibiting a transition from a low resistive state, commonly referred to as the superconducting state, to a high resistive state when a critical value of the electric current is exceeded. The secondary spool is coupled through a common part of magnetic flux with the primary spool. The secondary spool further comprises a metallic member which forms a closed loop circuit. The secondary spool is positioned in a cryostat that provides a cooling of the secondary spool. Magnetic coupling of two spools is provided though a ferromagnetic core.

A fault current limiting device is also known from the U.S. Pat. No. 5,694,279. The device comprises a primary spool comprising a metal or alloy and a secondary spool which includes quenchable superconductor which exhibits a transition from the low resistive state to the high resistive state when a critical value of the electric current is exceeded. Both of these spools are coupled through a common part of magnetic flux provided in a ferromagnetic core. The secondary spool is based on a number of thin and flat discs substrates coated with a layer of the quenchable superconductor, namely, a high temperature superconductor. The discs are provided with central openings which allow to install the discs in a cryostat and to position them around a magnetic core. The secondary spool may also comprise a cylindrical substrate coated with quenchable, high temperature superconductor.

Both of the above-referenced devices aim to condition electrical current in an external circuit which is connected in series to the primary spool. They may provide the function of a current limiter which provides limitation of the "primary" overcurrents. However, conventional devices display a reaction time which is too slow for some applications and may be too slow for efficient control of electric power.

SUMMARY

It is desirable to further improve the performance of current conditioning devices and to provide a more efficient control of electrical power where much shorter reaction times are required in order to not only provide a quick circuit protection but also to provide an desired fast dynamics for such protection.

It is an object of the present invention to provide a device for conditioning of the electrical current with a short reaction time. A further object of the present invention is to provide a device with a controllable reaction time, so that the reaction time may be predetermined and preinstalled. A further object of the invention is to provide an electrical device which may be produced more cost-effectively According to an embodiment, an electrical device for current conditioning may have a primary spool, a secondary spool which comprises a quenchable superconductor exhibiting a transition from a low resistive state to a high resistive state when a critical value of the electric current is exceeded, the secondary spool being coupled through a common part of magnetic flux with the primary spool, the secondary spool further comprising a metallic member which form a closed loop circuit, and a cryostat providing a cooling of the secondary spool, wherein:

the secondary spool comprises at least one element based on a substantial fraction of a non-quenchable conductor that exhibits a minor dependence of its resistance on current and magnetic field, and a fraction of the quenchable superconductor; and at least one turn of the non-quenchable conductor and the quenchable superconductor is electrically jointed in series providing a closed loop circuit.

BRIEF DESCRIPTION OF THE DRAWINGS

An electrical device for current conditioning in accordance with the present invention will now be described, by way of example, with reference to the following accompanying figures.

DETAILED DESCRIPTION

Figure 1:
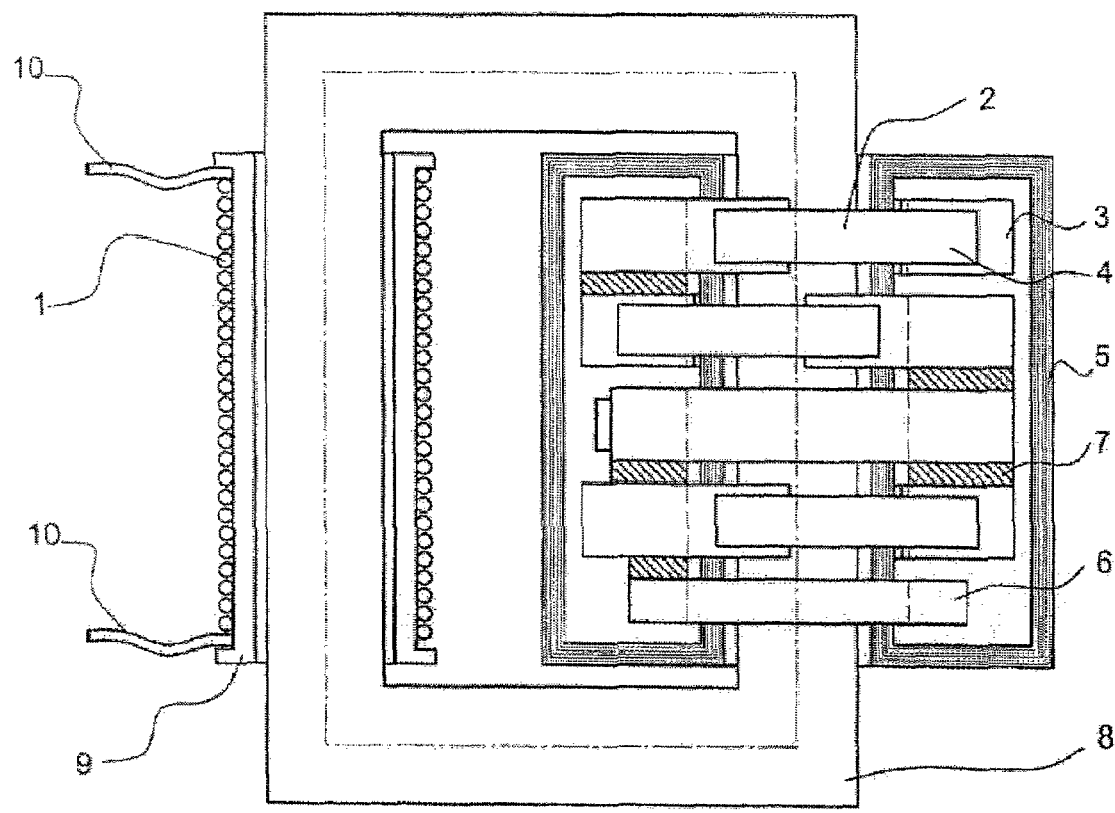
FIG. 1 A schematic view of a first embodiment of the electrical device.

According to an embodiment, an electrical device comprises a primary spool, a secondary spool which comprises a quenchable superconductor. A quenchable superconductor exhibits a transition from a low resistive state to a high resistive state when a critical value of an electric current is exceeded. The secondary spool is coupled through a common part of magnetic flux with the primary spool. The secondary spool further comprises a metallic member which forms a closed loop circuit. The electrical device further comprises a cryostat which provides a cooling of the secondary spool.

According to an embodiment, the secondary spool comprises at least one element or portion comprising a substantial fraction of a non-quenchable conductor and a fraction of the quenchable superconductor. The non-quenchable conductor exhibits a minor dependence of its resistance on current and magnetic field. According to an embodiment, the non-quenchable conductor may exhibit metallic properties. In this context a substantial fraction is defined as more than 50% by volume. According to an embodiment, the fraction f of non-quenchable conductor of the element of the secondary spool is in the range of 50%≦f≦95%, preferably 60%≦f≦95%, more preferably 75%≦f≦95%, even more preferably 80%≦f≦90% by volume. The volume of the element is the sum of the fraction of the non-quenchable conductor and the fraction of the quenchable superconductor.

According to an embodiment, the secondary spool comprises at least one turn which comprises the non-quenchable conductor and the quenchable superconductor electrically jointed in series to provide a closed loop circuit.

The construction or arrangement of the secondary spool according to an embodiment, results in more homogeneous quenching of the quenchable superconductor and leads to a reduction of the reaction time of the whole device.

According to an embodiment, the electric device may also further comprise an iron core.

According to an embodiment, the non-quenchable conductor in this electrical device may be based on a highly conductive metal as Cu, Ag, Au, Al, In or on a superconductor. In an embodiment, the quenchable superconductor is a so called low temperature superconductor, for example $Nb_3Sn$ or NbTi when the device is aimed for low temperature operation, i.e. at the temperatures of 2-10K.

In a further embodiment, the quenchable superconductor comprises a $ReBa_2Cu_3O_{7-x}$-based composition or a fine mixture thereof, where Re is one of more rare earth elements, preferably one or more elements from the group consisting of Y, Ho, Nd, La, Pr, Gd, Tb, Dy and Yb.

According to an embodiment, the quenchable superconductor in the electrical device may be formed as a single layer or may comprise a plurality of layers forming a multilayer structure.

According to an embodiment, a $ReBa_2Cu_3O_{7-x}$ based layer or multilayered structure are preferably provided in a form of a coated tape which is based on metallic substrate tape. According to an embodiment, either one side or two opposing sides of the substrate tape may be coated by a single $ReBa_2Cu_3O_{7-x}$-based layer or by a multilayer structure including a number of single $ReBa_2Cu_3O_{7-x}$-based layers. According to an embodiment, the substrate tape may comprise a stainless steel or a Hastelloy or a Ni-based alloy or a NiCr-based alloy tape which may exhibit a resistively of more than 80 $\mu\Omega\cdot cm$ (microohm·cm). According to an embodiment, the substrate tape may also further comprise one or more additional buffer layers disposed between the surface of the metallic substrate tape and the superconductor layer. The buffer layer may prevent undesired chemical reactions between the metallic substrate tape and the superconductor.

According to an embodiment, electrical jointing of the quenchable conductor to the non-quenchable conductor is achieved employing a layer of normal conductor such as In, Cu, or Pb or a superconductor such as BiSCCO (i.e. $Bi_2Sr_2CaCu_2O_x$, or $(BiPb)_2Sr_2Ca_2Cu_3O_x$), Eu(Bi)CCO, or their mixtures which have a different composition from the compositions used in either quenchable superconductor or non quenchable conductor.

In an embodiment, the secondary spool of the electrical device comprises a number of turns, each turn comprising a non-quenchable conductor and a quenchable superconductor according to one of the embodiments.

In a further embodiment, the non-quenchable conductor and the quenchable conductor forming a turn are capable of guiding the current in a perpendicular direction to the main axis of the magnetic flux. According to an embodiment, the magnetic flux may be provided by an iron core around which the primary spool and secondary spool are positioned.

In an embodiment, at least one of the non-quenchable conductor and the quenchable conductor comprises at least one portion which is capable of guiding the current along the main axis of magnetic flux. This allows a re-distribution of the current between different turns, and thus to form a desired reaction time of the entire device.

In an embodiment, a ratio of geometrical dimensions of different portions of the non-quenchable conductor or/and different portions of the quenchable superconductor varies for different turns of the non-quenchable conductor and the quenchable superconductor. This embodiment provides an efficient opportunity to achieve a pre-determined quench reaction.

In an embodiment, the ratios of geometrical dimensions of different portions of the non-quenchable conductor or/and different portions of the quenchable superconductor follow a numerical sequence or form a smooth distribution function. This advantageously enables jumps to be avoided during the quenching of the entire device.

In the latter embodiment, the width of the distribution function determines the time performance, such as the reaction time of the device.

In the case that the secondary spool comprises a number of the turns, according to an embodiment, the quenchable superconductor may advantageously comprise a plurality of $ReBa_2Cu_3O_{7-x}$ coated tapes.

If the secondary spool comprises a plurality of $ReBa_2Cu_3O_{7-x}$ coated tapes, according to an embodiment, the secondary spool may comprise at least two tapes exhibiting different thresholds of electrical current that causes quench. According to an embodiment, the at least two tape may exhibit different superconducting properties such as $J_c$ (critical current density) or $T_c$ (critical temperature). This provides an additional freedom in controlling the response function of the device and, thus, in providing a desired reaction time.

In an embodiment, the cryostat comprises at least one metallic wall forming a closed loop circuit which comprises at least a part of the common magnetic flux.

According to an embodiment, the metallic member and the metallic wall of the cryostat may be the same element of the electrical device.

According to an embodiment, the reaction time may be controlled by replacing or partially replacing the metallic member of the secondary spool with an "external" element of the cryostat apparatus.

The electrical device according to different embodiments may be more cost efficiently produced as the amount of quenchable superconductor provided in the device is substantially, by 50 to 90% lower compared to the known technical solutions. Superconducting tapes and in particular coated superconducting tapes which are fabricated by a number vacuum deposition steps are relatively expensive to produce. Since the secondary spool of the current conditioning device according to an embodiment comprises a substantial fraction of non-quenchable conductor, the fraction of quenchable superconductor is reduced. Additionally, the production costs for the cryostat are reduced as according to the embodiments, parts of the cryostat may be based on conventional metallic elements.

FIG. 1 reveals a schematic view of the first embodiment of the electrical device. The device comprises a primary spool 1 which comprises a normal metallic conductor such as Cu or Al, and a secondary spool which comprises a number of turns. Each turn 2 3 4 comprises a non-quenchable conductor 3, which in this case has the from of a Cu wire or tape, and a quenchable superconductor 2, which in this case is provided by a YBCO coated tape. The YBCO tape superconductor may be a biaxially textured YBCO film or coating which has been deposited on one side or two opposing sides of a flexible metal or alloy tape substrate. One or more buffer layers which also have a biaxial texture may be positioned between the substrate tape and the YBCO superconductor. The non-quenchable conductor 3 and the quenchable superconductor 2 are electrically jointed in series in such a way that they form a closed loop circuit. Jointing of these conductors is provided within jointing areas 4. The jointing areas 4 are positioned towards the ends of the superconductor tape 2 and the ends of the copper wire 3. In this embodiment the superconductor tape 2 is longer than the gape between the two ends of the copper wire so that the ends of the superconductor tape overlap the ends of the copper wire. The jointing area is therefore formed by these overlapping regions. The joint between the non-quenchable conductor 3 and the quenchable superconductor 2 is achieved by employing a layer of normal In conductor which was employed as a soldering material forming a thin interlayer. In this embodiment, one side of the metallic substrate is coated by YBCO superconductor. The joint between the superconductor tape 3 and the copper wire 2 is formed between the uncoated metallic substrate of the superconductor tape 3 and the copper wire 2.

Experiments have demonstrated that a sufficient quality or electrical jointing may be provided employing pressed or soldered contacts based on layers of Cu, Pb or high temperature superconductors as BiSCCO or, Eu(Bi)CCO. The plurality of turns 2-4 are capable of guiding the current in a perpendicular direction to the main axis of the magnetic flux (marked with a point-dash line in FIG. 1). The turns 2-4 are placed in a cryostat 5. The device is equipped with a Cu member 6 that forms closed loop. The secondary spool of the device also comprises metallic spacers 7 which are electrically connected to the non-quenchable conductor 3 between adjacent turns of the secondary spool in order to allow to guide the current along the main axis of magnetic flux (dash-point line of FIG. 1) provided in an iron core 8 that create an efficient coupling of the primary spool with the secondary spool based on elements 2-4 and 6. In practice, the primary spool 1 may be located not only in a way shown in FIG. 1 but at any other position at the iron core 8. This spool may be located as well inside or outside the secondary spool at the right arm of the iron core 8.

Further elements of the apparatus of the electrical device are an insulating cylinder core 9 serving as holder of the primary spool 1 and current leads 10 delivering current to the primary spool 1.

In operation, the current leads 10 are connected in series to an ac power circuit not shown in the figures. The cryostat 5 is filled with liquid nitrogen or other condensed gas. While the current that flows through the primary coil does not reach a threshold value, the electrical device introduces a very small drop of voltage which results in a small power loss. A small power loss of 0.03% was observed for a 6 kW testing prototype.

When the current in the primary spool exceeds the threshold value, the quenchable superconductor of the secondary spool enters a highly resistive state and the electrical device starts to introduce additional impedance to the external electrical circuit to which it is coupled. The current flowing in the external electrical circuit is conditioned. The device acts partly as an inductive load and partly as a resistive load which conditions the current in the primary circuit regarding its phase and amplitude. One of the known tasks that may be solved by such current conditioning is a limitation of the current.

In the case of an electrical device comprising 8 turns based on $YBa_2Cu_3O_{7-x}$ coated tapes as a quenchable superconductor, the current was limited to 1600 A (rms) in the secondary spool and respectively to 14 A (rms) in the primary 380V-circuit. Each coated tapes was 1 cm wide and 10 mm thick. Thickness of the YBCO layer was about 2 μm. Critical current of single tape was approximately of 280 A (at 77K and self field); current density in $YBa_2Cu_3O_{7-x}$ was of 1.4 MA/cm². Interface of the $YBa_2Cu_3O_{7-x}$ was coated with a 0.5 μm thick silver or gold protective layer that was electrically jointed with the metallic substrate. The onset current in the secondary spool is additionally determined by the metallic member 6 which under full power load functions as an effective shunt that protects the quenchable superconductor against too high overcurrent. The reaction time of the device corresponds to 45 microseconds. The device exhibited an extra short, recovery time, i.e. the time needed to return to the initial state of the electrical device: the recovery time was less than 50 ms at full power loads (to be compared with a typical value of 0.5 to 20 seconds for known devices).

Further variants of the electrical device shown in the FIG. 1 may be based on a different location of the primary spool 1 relative to the iron core 8 and the secondary spool 2-4, 6. The primary spool may be located at any position including its coaxial positioning relative to the secondary spool 2-4, 6. In the latter case, the primary spool 1 may either located outside the outer surface of the cryostat 5 or between the cryostat 5 and the iron core 8. A further alternative is to provide the iron core 8 in a different form; not as a rectangular shaped core as it is shown in FIG. 1 but for example as a toroid.

Figure 2:
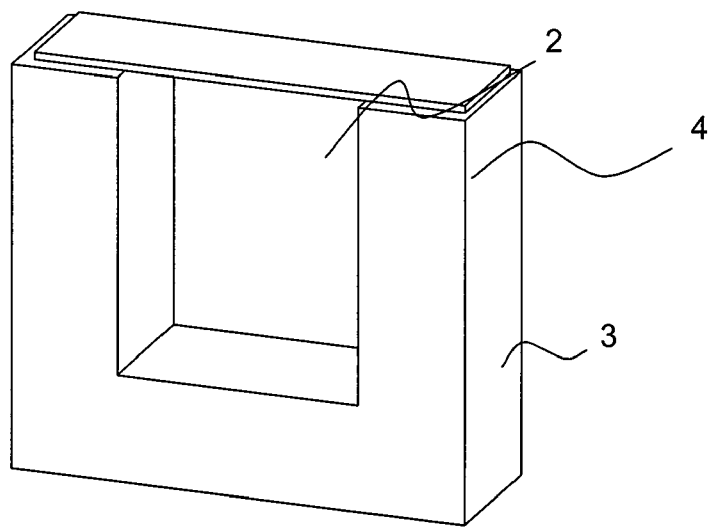
FIG. 2 A schematic view of a single turn of secondary spool based on electrically jointed a non-quenchable conductor and a quenchable superconductor according to an embodiment.
Figure 3:
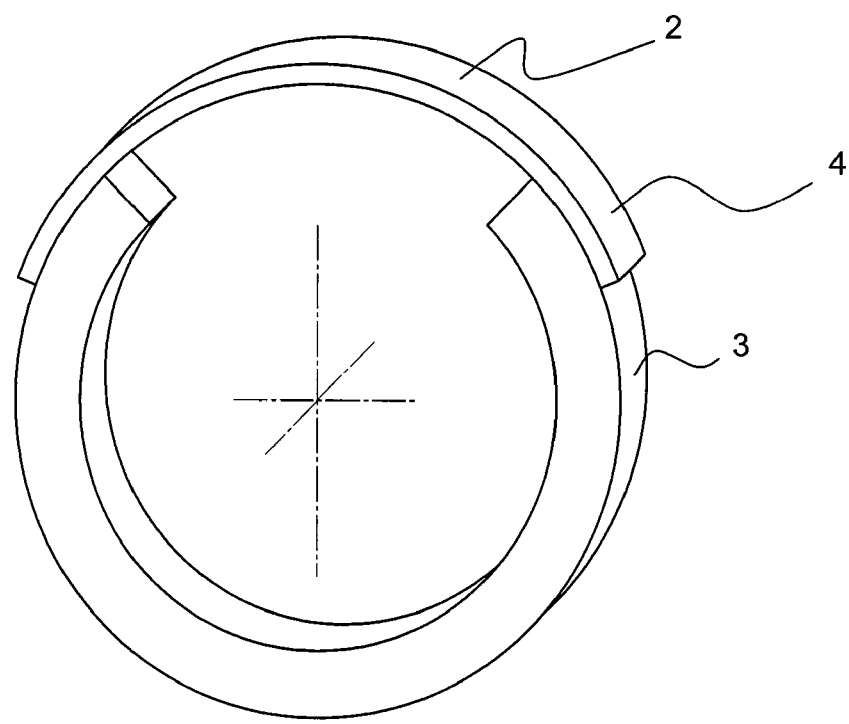
FIG. 3 A schematic view of a circular variant of a single turn of secondary spool based on electrically jointed a non-quenchable conductor and a quenchable superconductor according to an embodiment.

Two variants of the construction of a single turn are depicted in FIG. 2 and FIG. 3. FIG. 2 reveals a rectangular shaped turn and FIG. 3 relates to a circular shaped turn. Each turn has a portion of non-quenchable conductor 3 and a portion of a quenchable superconductor 2 mechanically and electrically connected to form a closed loop. In both figures, the same denotations as in FIG. 1 are used.

Figure 4A:
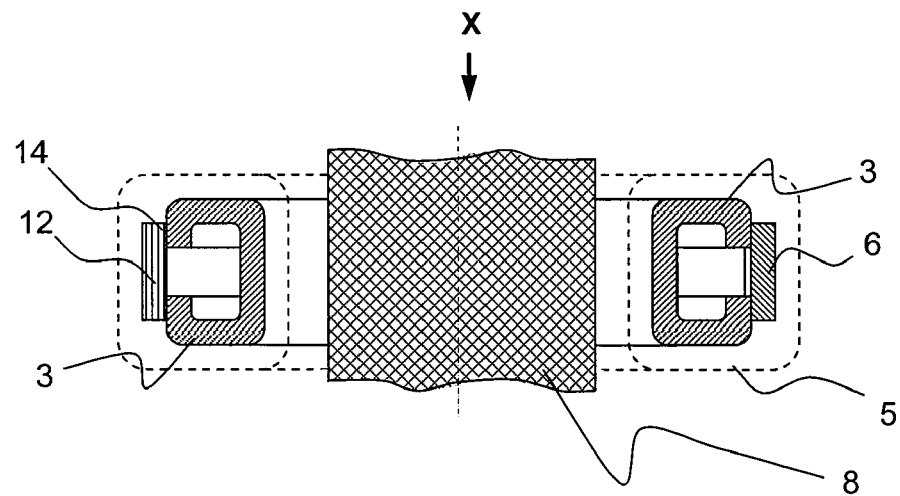
FIG. 4a A cross sectional schematic view of a second embodiment of the electrical device.
Figure 4B:
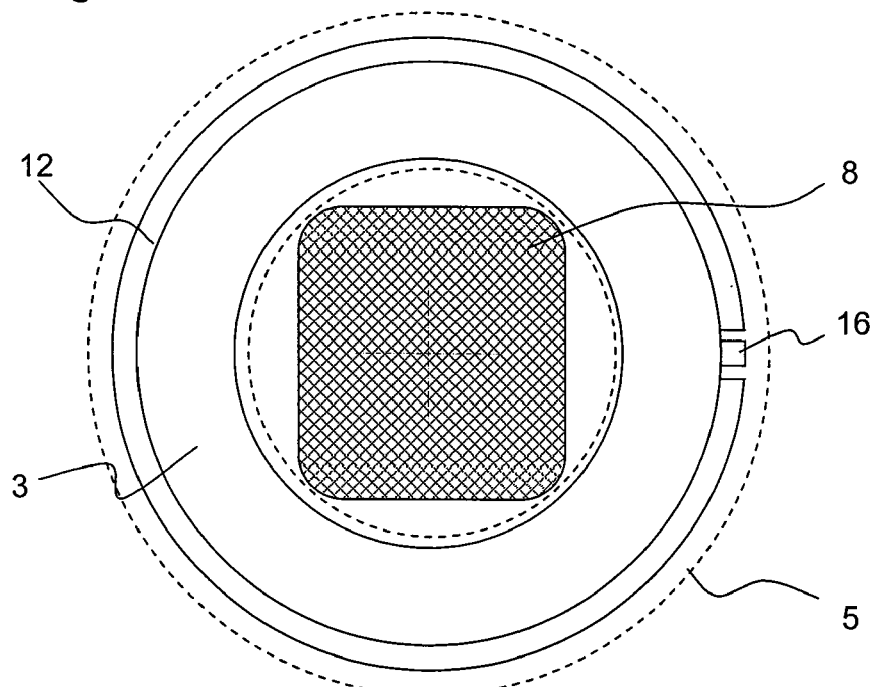
FIG. 4b An alternative schematic view of a second embodiment of the electrical device.

A second embodiment of the electrical device is schematically depicted in FIG. 4a and FIG. 4b. The non-quenchable Cu conductor 3 has the form of, in this case, a toroid with a slit in the external wall. To the edges 14 of the slit, an YBCO coated tape is jointed in such a way that it forms a semi-closed ring 12. A metallic member 16 is formed as Cu bridge soldered to the same edges 14. The secondary spool comprising parts 3, 12, 16 is placed in a cryostat 5. The primary spool as well as a complete view of the iron core 8 is not shown in FIG. 4a and FIG. 4b.

In operation, the device was found to exhibit a very similar performance compared to the first embodiment of FIG. 1 with a difference in the reaction time which in the actual case becomes even shorter: it is less than 35 microseconds.

Figure 5:
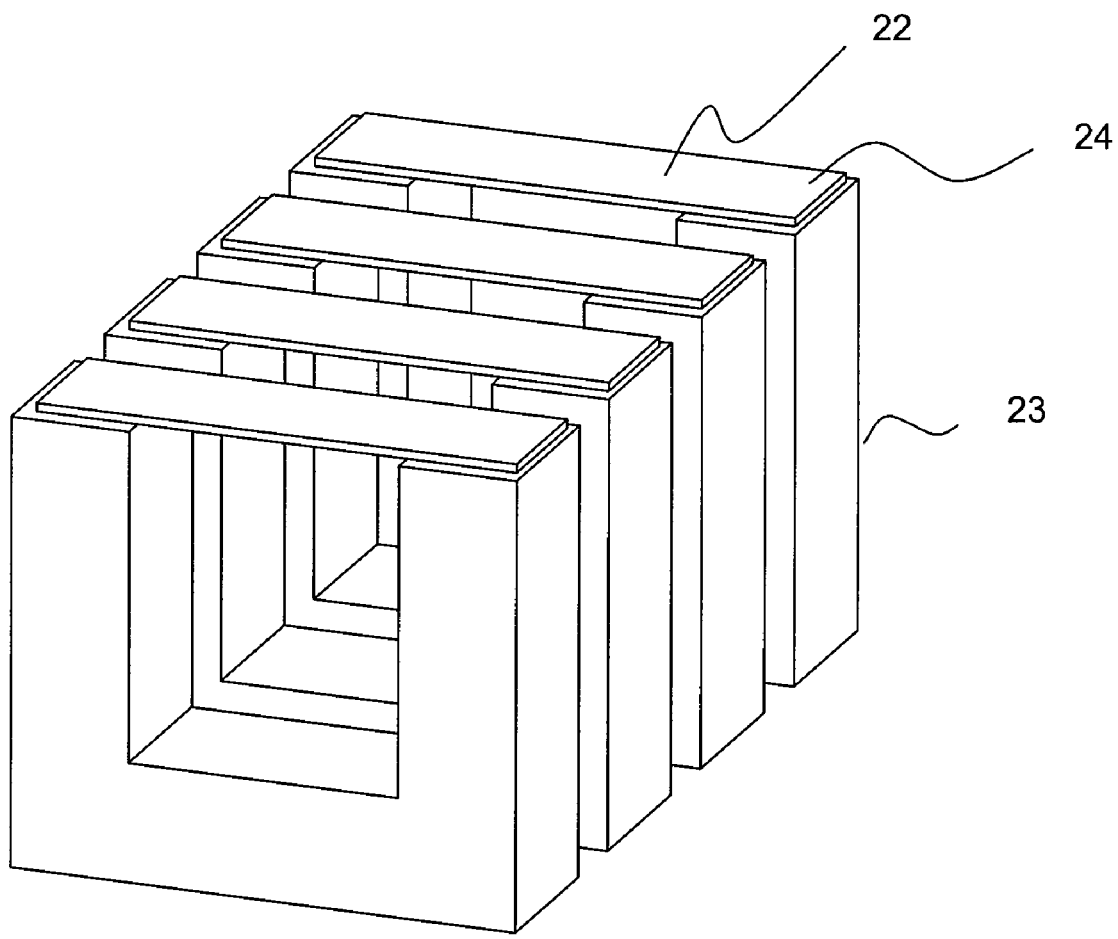
FIG. 5 A schematic view of a variant of arrangement of a number of turns in the secondary spool.

FIG. 5 represents a variant of arrangement of a number of turns in the secondary spool. In this variant no interconnection of turns in the direction which is parallel to the direction of magnetic flux is provided. All turns are substantially equal and comprise a quenchable superconductor 22 and a non-quenchable conductor 23 electrically jointed in areas 24. The non-quenchable conductor 23 has a U-shape with a superconductor tape 22 disposed between the two ends of the U-shape to form a closed loop. In this embodiment the U-shaped non-quenchable conductor 23 has a wall thickness approximately that of the width of the superconductor tape 22 and the superconductor tape 22 extends between the top surface of each of the arms of the U-shaped non-quenchable conductor 23. An electrical device having such an arrangement exhibits a rather short reaction time of about 50 microseconds.

Figure 6:
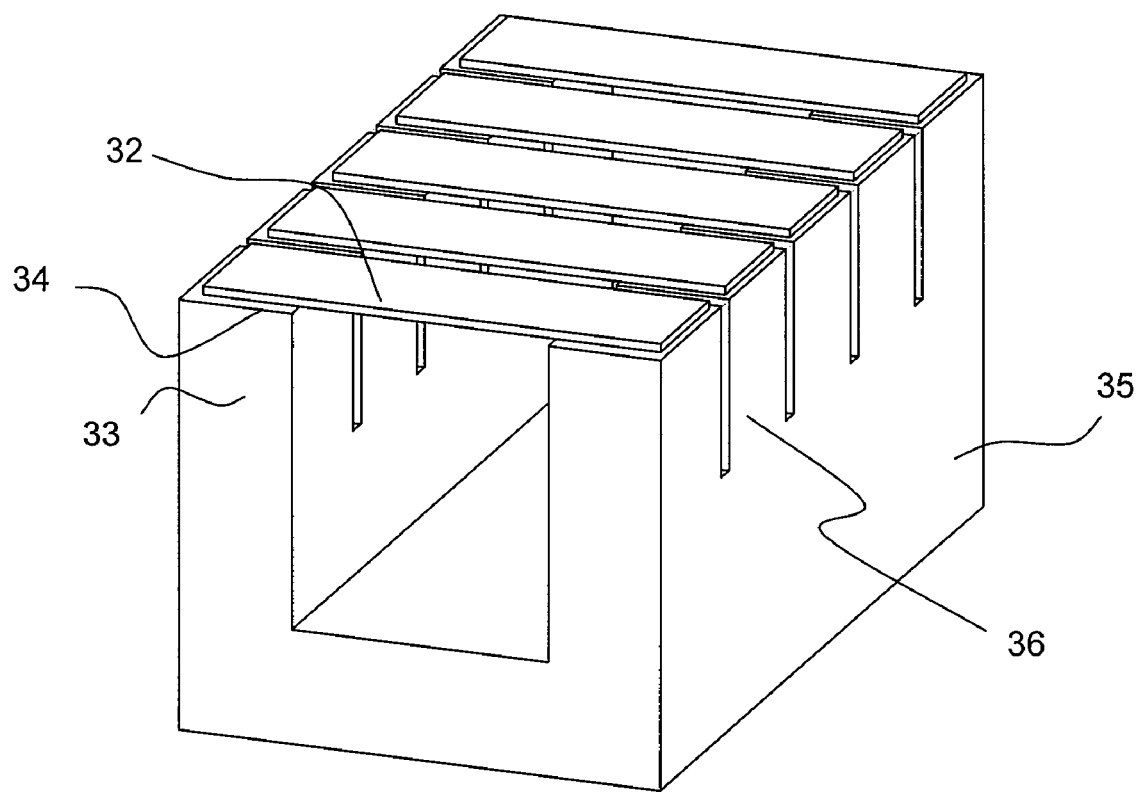
FIG. 6 A schematic view a further variant of arrangement of a number of turns in the secondary spool.

FIG. 6 depicts a further variant of arrangement of a number of turns in the secondary spool. As before, all turns are substantially equal. Each turn comprises a portion of a quenchable superconductor 32 electrically jointed to a non-quenchable conductor 33 in areas 34. The non-quenchable conductor 33 possesses a common part 35 that interconnects the different turns in the direction of the magnetic flux. Some parts of the non-quenchable conductor 33 are not interconnected because of a set of slits 36 provided in the conductor 33. The non-quenchable conductor 33 can be thought as being a rectangular block with a channel disposed on one face of the block to from two protruding arms. The non-quenchable conductor 33 has a cross-sectional U-shape. A series of slits, each having substantially the same dimensions, are positioned in the outer surface of each of the two arms to provide a series of turns of substantially the same width and height which are mechanically and electrically joined by the base of the block. The two series of slits are therefore substantially aligned with one another.

Thus, the non-quenchable conductor is capable in this case of guiding the current along the main axis of magnetic flux. This results in a re-distribution of the current between different turns, and in an improved time stability of the device while deviation of local parameters of quenchable coated tapes 32 provide less influence to the performance of the entire electrical device.

A similar effect may be achieved using a partial interconnection through the quenchable superconductor. The reaction time is equally short as in the case considered in FIG. 5.

Figure 7:
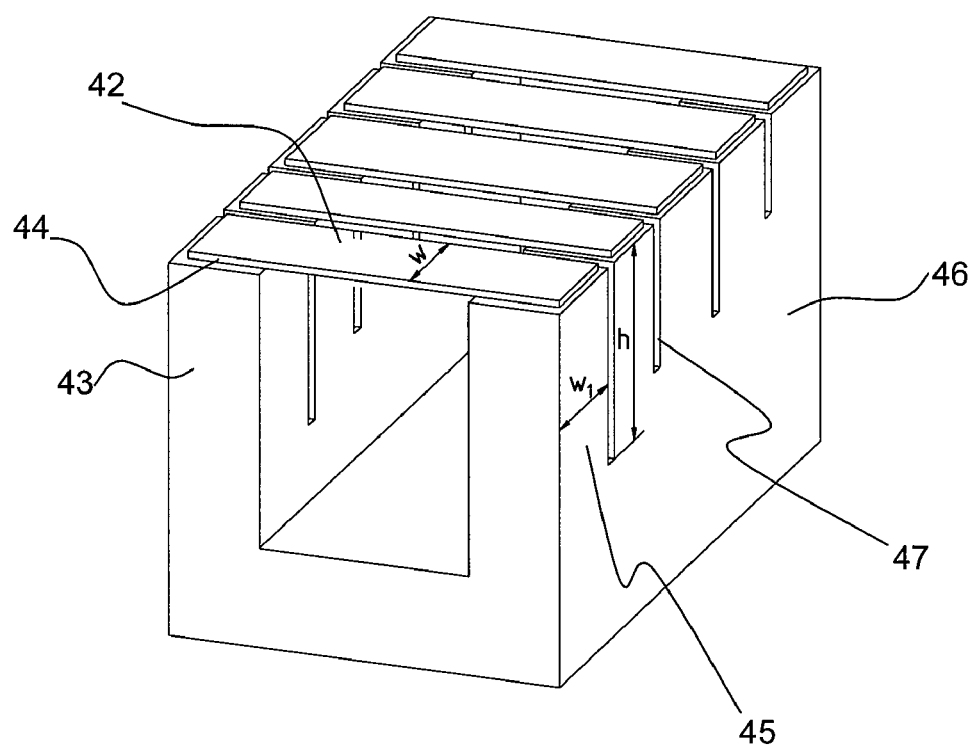
FIG. 7 A schematic view of an "inhomogeneous" arrangement of a number of turns of secondary spool.

A schematic view of an "inhomogeneous" arrangement of a number of turns of secondary spool according to an embodiment is shown in FIG. 7. In this case different turns 42-44 are provided with a different geometrical width $w_1$ and different length h of the turn portions 45. These portions do not provide electrical interconnection to other turns. Such interconnection is provided in a "common" part 46 of the non-quenchable conductor. In the present example, geometrical parameters $w_1$ and h are determined by a position and depth of slits 47. Similarly to FIG. 6, the non-quenchable conductor 43 can be thought as being a rectangular block with a channel disposed on one face of the block to from two protruding arms. The non-quenchable conductor 43 has a cross-sectional U-shape. A series of slits are positioned in the outer surface of each of the two arms to provide a series of turns. In this embodiment the slits are provided with different dimensions. In FIG. 7 it can be seen that the depth of the slit decreases from the front to the back of the block shown in the orientation of FIG. 7. The two series of slits positioned in each arm are substantially aligned with one another forming a series of pairs of slits. Each pair has substantially the same size to provide a series of protrusions each forming a portion of a turn. The height and width of the protruding portions, therefore, varies and can be thought of an inhomogeneous.

It is shown experimentally that the reaction time as well as a time dependence of the impedance increase during current conditioning is strongly dependent on the distribution of these geometrical parameters for a given number of turns. At constant parameters of the strips of the quenchable superconductor 42, a variation of w1 between 10 mm and 17 mm with a 1 mm step or interval was provided for secondary coil based on 8 turns. An increase of reaction time of the entire device from 40 ms to 110 ms was observed. The response of the electrical device during current conditioning may, therefore, be controlled by providing the secondary coil with an arrangement of the quenchable superconductor and non-quenchable conductor which produces the desired response time.

The smoothness of the distribution function of such variations results in smooth time-variation of impedance during current conditioning. This may be understood taking into account geometrical parameters of channels in the not-quenchable conductor determine distribution of current between different turns, and, therefore, a sequence of their quenching at current overloads. Thus, a width of the distribution function of geometrical parameters (which in turn defines amplitude of variations of these parameters) is determining the time-width of electrical response of entire device, i.e. the entire reaction time. Furthermore, the "smoothness" of the distribution function enables current jumps to be avoided during operation of the entire device.

Similar results may be provided by varying the electrical parameters of the pieces of the quenchable superconductor employed in different turns. In practice, both possibilities, i.e. the variation of parameters of the not-quenchable conductor and of the quenchable superconductor, may be used together with an additional advantage that the entire reaction time may be not only increased but also be shortened in a controllable way due to a compensation of the intrinsic inhomogeneity of critical current in the quenchable superconductor by properly chosen ratio of geometrical parameters of the not-quenchable conductor within each turn.

Employment of a multitude of short quenchable superconductors in the examples demonstrated in FIG. 1 and FIG. 5-FIG. 7 results in an improvement of cost efficiency of production and maintenance of the electrical device as mounting and replacement procedures become less time- and material consuming.

What is claimed is:

1. An electrical device for current conditioning comprising a primary spool, a secondary spool which comprises a quenchable superconductor exhibiting a transition from a low resistive state to a high resistive state when a critical value of the electric current is exceeded, the secondary spool being coupled through a common part of magnetic flux with the primary spool, the secondary spool further comprising a metallic member which form a closed loop circuit, and a cryostat providing a cooling of the secondary spool, wherein:

the secondary spool comprises at least one element based on a substantial fraction of a non-quenchable conductor that exhibits a minor dependence of its resistance on current and magnetic field, and a fraction of the quenchable superconductor; and at least one turn of the non-quenchable conductor and the quenchable superconductor is electrically jointed in series providing a closed loop circuit.

2. The electrical device according to claim 1, wherein the non-quenchable conductor comprises a highly conductive metal as Cu, Ag, Au, Al, In or a superconductor as $Nb_3Sn$, NbTi.

3. The electrical device according to claim 1, wherein the quenchable superconductor comprising a $ReBa_2Cu_3O_{7-x}$ composition or its fine mixture, where Re is one or more elements from the group consisting of Y, Ho, La, Pr, Nd, Gd, Tb, Dy, and Yb.

4. The electrical device according to claim 1, wherein the quenchable conductor is formed as a single layer or as a set of layers of a multilayer structure.

5. The electrical device according to claim 3, wherein the $ReBa_2Cu_3O_{7-x}$ coated tape comprises a metallic substrate tape, preferably comprising stainless steel or a Ni-based alloy or a NiCr-based alloy or Hastelloy, preferably exhibiting a resistivity of more than 80 µΩ·cm.

6. The electrical device according to claim 1, wherein the electrical jointing is provided by a layer of normal conductor or superconductor as In, Cu, Pb or superconductor as BiS-CCO, Eu(Bi)CCO, or their mixtures which have a different composition from the compositions used in either quenchable or non quenchable superconductor.

7. The electrical device according to claim 1, comprising a number of turn, each turn comprising the non-quenchable conductor and the quenchable superconductor.

8. The electrical device according to claim 1, wherein both the non-quenchable conductor and the quenchable superconductor forming the same turn are capable of guiding the current in a perpendicular direction to a main axis of magnetic flux.

9. The electrical device according to claim 1, wherein at least one of the non-quenchable conductor and the quenchable conductor comprises at least one portion which is capable of guiding the current along the main axis of magnetic flux.

10. The electrical device according to claim 9, wherein a ratio of geometrical dimensions of different portions of the non-quenchable conductor or/and different portions of the quenchable superconductor varies for different turns of the non-quenchable conductor and the quenchable superconductor.

11. The electrical device according to claim 10, wherein the ratios of geometrical dimensions of different portions of the non-quenchable conductor or/and different portions of the quenchable superconductor follow a numerical sequence or form a smooth distribution function.

12. The electrical device according to claim 11, wherein the width of the distribution function determines the time performance of the device.

13. The electrical device according to claim 7, wherein the quenchable conductor is based on a plurality of $ReBa_2Cu_3O_{7-x}$ coated tapes.

14. The electrical device according to claim 13, wherein the multitude of coated tapes comprises at least two tapes exhibiting different thresholds of electrical current that causes quench.

15. The electrical device according to claim 1, wherein the cryostat comprises at least one metallic wall forming a closed loop circuit which comprises at least a part of the common magnetic flux.

16. The electrical device according to claim 1, wherein the at least one metallic member and the at least one metallic wall of the cryostat are the same element of the electrical device.

17. The electrical device according to claim 1, wherein the fraction f of non-quenchable conductor of the element of the secondary spool is in the range of $50\% \leq f \leq 95\%$ by volume, whereby the volume of the element is the sum of the fraction of the non-quenchable conductor and the fraction of the quenchable superconductor.

18. The electrical device according to claim 17, wherein the fraction f of non-quenchable conductor of the element of the secondary spool is in the range of $60\% \leq f \leq 95\%$ by volume, whereby the volume of the element is the sum of the fraction of the non-quenchable conductor and the fraction of the quenchable superconductor.

19. The electrical device according to claim 17, wherein the fraction f of non-quenchable conductor of the element of the secondary spool is in the range of $75\% \leq f \leq 95\%$ by volume, whereby the volume of the element is the sum of the fraction of the non-quenchable conductor and the fraction of the quenchable superconductor.

20. The electrical device according to claim 17, wherein the fraction f of non-quenchable conductor of the element of the secondary spool is in the range of $80\% \leq f \leq 90\%$ by volume, whereby the volume of the element is the sum of the fraction of the non-quenchable conductor and the fraction of the quenchable superconductor.

* * * * *